(12) United States Patent
Ozawa

(10) Patent No.: US 9,269,058 B2
(45) Date of Patent: Feb. 23, 2016

(54) LASER MACHINING METHOD, LASER MACHINING APPARATUS, AND LASER MACHINING PROGRAM

(71) Applicant: Via Mechanics, Ltd., Ebina-shi, Kanagawa (JP)

(72) Inventor: Hidekatsu Ozawa, Kanagawa (JP)

(73) Assignee: Via Mechanics, Ltd., Ebina-shi (JP)

( * ) Notice: Subject to any disclaimer, the term of this patent is extended or adjusted under 35 U.S.C. 154(b) by 371 days.

(21) Appl. No.: 13/945,509

(22) Filed: Jul. 18, 2013

(65) Prior Publication Data
US 2015/0021304 A1    Jan. 22, 2015

(51) Int. Cl.
| | |
|---|---|
| *B23K 26/04* | (2014.01) |
| *B23K 26/382* | (2014.01) |
| *H05K 3/00* | (2006.01) |
| *G06Q 10/04* | (2012.01) |
| *B23K 26/38* | (2014.01) |
| *B23K 26/06* | (2014.01) |
| *B23K 26/08* | (2014.01) |
| *B23K 26/40* | (2014.01) |
| *B23K 26/02* | (2014.01) |

(52) U.S. Cl.
CPC ............. *G06Q 10/043* (2013.01); *B23K 26/04* (2013.01); *B23K 26/0648* (2013.01); *B23K 26/082* (2015.10); *B23K 26/0853* (2013.01); *B23K 26/38* (2013.01); *B23K 26/381* (2013.01); *B23K 26/382* (2015.10); *B23K 26/40* (2013.01); *H05K 3/0008* (2013.01); *H05K 3/0026* (2013.01); *B23K 26/02* (2013.01); *B23K 2203/50* (2015.10); *H05K 3/00* (2013.01); *H05K 3/0005* (2013.01)

(58) Field of Classification Search
CPC ...... B23K 26/38; B23K 26/382; B23K 26/02; B23K 26/04; H05K 3/00
USPC ............. 219/121.7, 121.71, 121.61, 121.62, 219/121.85; 700/166, 182, 190, 191
See application file for complete search history.

(56) References Cited

U.S. PATENT DOCUMENTS

| | | | | |
|---|---|---|---|---|
| 5,688,418 | A * | 11/1997 | Yoshiyasu ............ | B23K 26/388 219/121.62 |
| 6,777,641 | B2 * | 8/2004 | Cole, III ................ | B23K 26/04 219/121.67 |

(Continued)

FOREIGN PATENT DOCUMENTS

| | | |
|---|---|---|
| JP | 2001-195112 A | 7/2001 |
| JP | 2008-49398 A | 3/2008 |
| JP | 2013-105431 A | 5/2013 |

*Primary Examiner* — Samuel M Henrich
(74) *Attorney, Agent, or Firm* — Crowell & Moring LLP

(57) ABSTRACT

Variation in hole diameter due to heating effects is minimized even if the shortest machining route is set, and machining quality is improved. A printed circuit board to be scanned by a laser beam is divided into a plurality of scan areas (S1). An order of drilling within the scan area is sorted to obtain a scanning route with the shortest distance (S2). The order of the (N+1)th hole and the (N+2)th hole is swapped in each scanning area if it is determined that the distance between the Nth hole and the (N+1)th hole (here, N is an integer in a range of 1≤N≤"the maximum number of holes to be drilled in the area"−1") is less than a predetermined threshold value, and that N+1 is not correspond to the maximum number of holes to be drilled in the scanning area (S3). The scanning area is machined and then machining each scanning area, specifically in machining the (N+1)th hole, after pausing for a period of a predetermined heat dissipation time if it is determined that the distance between the N-th hole and the (N+1)th hole swapped is less than the predetermined threshold value. Subsequently, machining is performed (S4).

3 Claims, 10 Drawing Sheets

(56) References Cited

U.S. PATENT DOCUMENTS

| | | | | |
|---|---|---|---|---|
| 8,487,213 B2* | 7/2013 | Asai | ................... | B23K 9/0216 219/124.1 |
| 2002/0108939 A1* | 8/2002 | Mayer | ................. | B23K 26/043 219/121.79 |
| 2008/0300588 A1* | 12/2008 | Groth | ................ | A61B 18/1206 606/34 |

* cited by examiner

LASER MACHINING METHOD, LASER MACHINING APPARATUS, AND LASER MACHINING PROGRAM

CROSS-REFERENCE TO RELATED APPLICATION

This application is based on Japanese Patent Application No. 2011-250753 filed with the Japan Patent Office on Nov. 16, 2011, the entire content of which is hereby incorporated by reference.

BACKGROUND

1. Technical Field

The present invention relates to a laser machining method, a laser machining apparatus, and a laser machining program, more specifically, relates to a laser machining method and a laser machining apparatus for setting an optimum machining route for drilling a plurality of holes in a substrate by irradiation with a laser beam, and relates to a laser machining program executed by this laser machining apparatus.

2. Related Art

Examples of such techniques are found in JP-A-2001-195112 (hereinafter referred to as Patent Document 1) and JP-A-2008-049398 (hereinafter referred to as Patent Document 2). In Patent Document 1, a laser drilling route determination method for shortening computation time that is required for route determination is proposed as follows: This laser drilling route determination method applies an algorithm for the traveling salesman problem to determine a route specifying an order of positions to be drilled with a laser beam based on information of a plurality of drilling positions which are set up in advance. In this technique, a route determination based on an algorithm for the traveling salesman problem includes: dividing a machining region including positions to be drilled with a laser beam into a plurality of buckets, determining a traveling route visiting each of the plurality of divided buckets, determining a start extremity and an end extremity in each divided bucket, and determining an optimum route visiting positions to be drilled with the laser beam from the start extremity to the end extremity in each divided bucket. The start extremity is set to the starting point of laser beam irradiation in each divided bucket, and the end extremity is set to the end point of the laser beam irradiation. The end extremity in one bucket is associated with the start extremity in the next bucket to travel.

On the other hand, in Patent Document 2, a laser drilling method is proposed as follows: This laser drilling method can reduce generation of wavelike deformation and the like even in the case where a sheet-shaped member with a low heat resistance is drilled at a narrow pitch. This technique is a method for drill machining by sequential irradiation with a laser beam to a plurality of positions to be drilled in a sheet-shaped member. In at least a part of the plurality of positions to be drilled, one position to be drilled is irradiated with a laser beam, and then another position to be drilled is irradiated with the laser beam if the latter position is out of a predetermined range of distance from the former position, but the latter position is skipped if the latter position is within the predetermined range and then still another position out of the predetermined range is irradiated with the laser beam.

SUMMARY

The technique described in Patent Document 1 divides one machining region into a plurality of buckets, and determines the shortest route applying the nearest neighbor algorithm and the 2-opt algorithm so as to improve the machining speed. However, the technique described in Patent Document 1 performs laser machining on the shortest route. Thus, there has been a possibility that when an immediately adjacent position is irradiated by laser, the diameter of the adjacent hole becomes larger than a predetermined hole diameter due to cumulative heating effects. This may reduce the machining quality.

On the other hand, in the technique described in Patent Document 2, hole machining is performed so that the immediately adjacent position is not irradiated by laser to eliminate influence of the heating effects.

However, in the technique described in Patent Document 2, every other position is machined. Accordingly, laser irradiation with the shortest route is impossible. This causes a long machining route and a reduced machining efficiency.

An object of the present invention is to minimize the variations in hole diameter due to cumulative heating effects even in the case where the shortest machining route is set and improve machining quality.

To solve the problem above, the present invention is a laser machining method for drilling a plurality of holes on a printed circuit board with a laser beam. The laser machining method includes: providing a scanning means for scanning the laser beam emitted from a laser beam source onto a surface of the printed circuit board in an X direction and a Y direction; providing an XY table for moving the printed circuit board in the X direction and the Y direction; dividing the printed circuit board to be scanned by the laser beam into a plurality of scan areas; sorting an order of drilling within each scan area to obtain the shortest scanning route; swapping the order of the (N+1)th hole and the (N+2)th hole, in each scanning area, if it is determined that the distance between the N-th hole and the (N+1)th hole (here, N is an integer in a range of $1 \leq N \leq$ "the maximum number of holes to be drilled in the area"$-1$) is less than a predetermined threshold value, and that N+1 is not the maximum number of the holes to be drilled in the scanning area; and machining each scanning area, specifically in machining the N-th hole; and then machining the (N+1)th hole, after pausing for a period of a predetermined heat dissipation time if it is determined that the distance between the N-th hole and the (N+1)th hole swapped is less than the predetermined threshold value.

This minimizes the variations in hole diameter due to heating effects even in the case where the shortest machining route is set.

The present invention minimizes the variations in hole diameter due to heating effects even in the case where the shortest machining route is set and improves machining quality.

DETAILED DESCRIPTION

Figure 1:
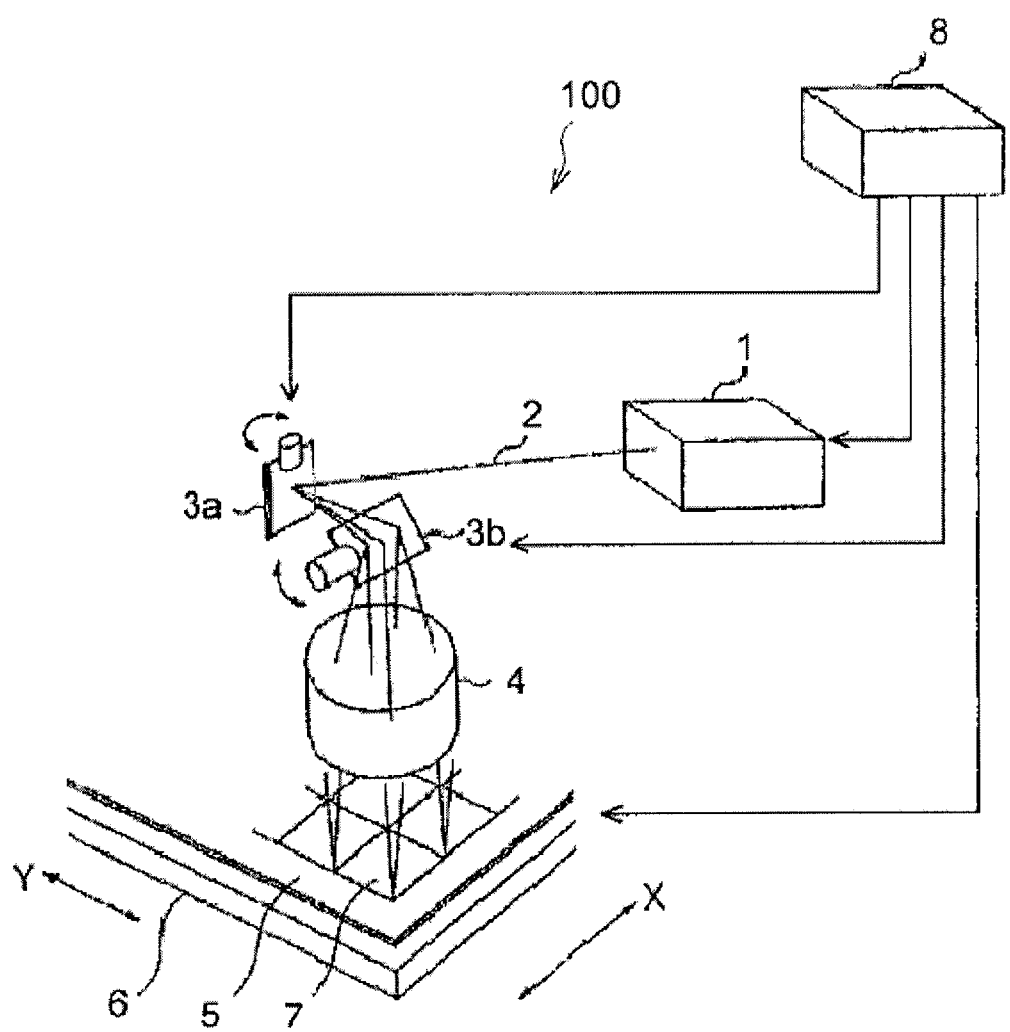
FIG. 1 is a diagram illustrating a schematic diagram of a laser machining apparatus according to an embodiment of the present invention.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Hereinafter, an embodiment of the present invention will be described with reference to the accompanying drawings.

FIG. 1 is a schematic diagram illustrating a laser machining apparatus according to the embodiment of the present invention. In this diagram, a laser machining apparatus 100 basically includes a laser beam source 1, first and second galvanometer mirrors 3a and 3b, an fθ lens 4, an XY table 6, and a control device 8.

In the laser machining apparatus 100 of such configuration, a laser beam is emitted from the laser beam source 1, and scanned onto a printed circuit board 5, which is secured onto the XY table 6, in the X direction and the Y direction via the first and second galvanometer mirrors 3a and 3b and the fθ lens 4. That is, the laser beam 2 impinges on the surface of the printed circuit board 5 through the fθ lens 4. At this time, the laser beam 2 is scanned in the X direction by the first galvanometer mirror 3a and scanned in the Y direction by the second galvanometer mirror 3b. The XY table moves the printed circuit board 5 in the X direction and Y direction. The first and second galvanometer mirrors 3a and 3b are driven by respective galvanometer scanners (not shown). Each galvanometer scanner changes (tilts) the angle of its associated mirror. The control device 8 includes a CPU and a memory (not shown) as a control unit to control the laser beam source 1, the galvanometer scanners, and the XY table 6.

The CPU includes a controlling unit and processing unit. The controlling unit controls interpretation of an instruction and a control process of a program, and the processing unit performs mathematical operation. The program is stored in the memory (not shown). An instruction (a numerical value or a series of numerical values) to be executed is extracted from the memory where the program is stored, and the program is executed.

Figure 2:
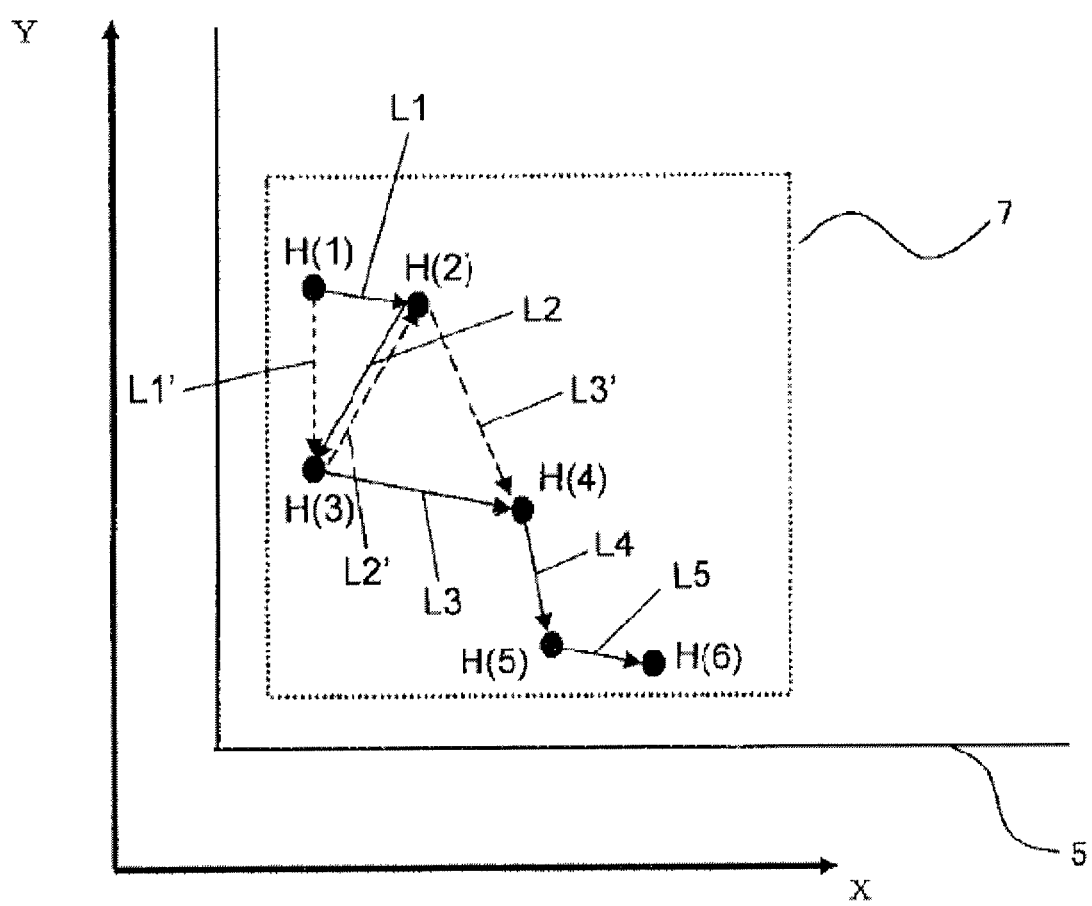
FIG. 2 is a diagram illustrating exemplary laser machining routes of the laser machining apparatus in the embodiment of the present invention.

FIG. 2 is a diagram illustrating exemplary laser machining routes of the laser machining apparatus in this embodiment. This diagram is a plan view illustrating a state where the printed circuit board 5 is secured onto the XY table 6 whose surface forms the XY plane, and depicts positions of holes from a first hole H(1) to a sixth hole H(6) within a scan area 7 on the printed circuit board 5 and machining routes.

In an example illustrated in FIG. 2, six holes from the first hole H(1) to the sixth hole H(6) are arranged within the scan area 7 set by dividing the surface of the printed circuit board 5. The size of the scan area 7 is determined by the size of the fθ lens 4. The shortest route (illustrated by a solid line) obtained by sorting the hole position data within the scan area 7 corresponds to paths L1, L2, L3, L4, and L5 concatenated in numerically ascending order from the first hole H(1) to the sixth hole H(6). Paths L1', L2', L3', L4, and L5 include some paths changed their connections to prevent heating effects generated in machining of the first hole H(1), from affecting the machining of the second hole H(2) in the case where the distance from the first hole H(1) to the second hole H(2) is short. The route L1' is the path from the first hole H(1) to the third hole H(3) instead of the hole H(2). The path L2' is the path from the third hole H(3) to the second hole H(2). The path L3' is the path from the second hole H(2) to the fourth hole H(4). Incidentally, the memory referred by the CPU executing the program stores respective coordinate values of the holes H(1) to H(6) for machining.

Figure 3:
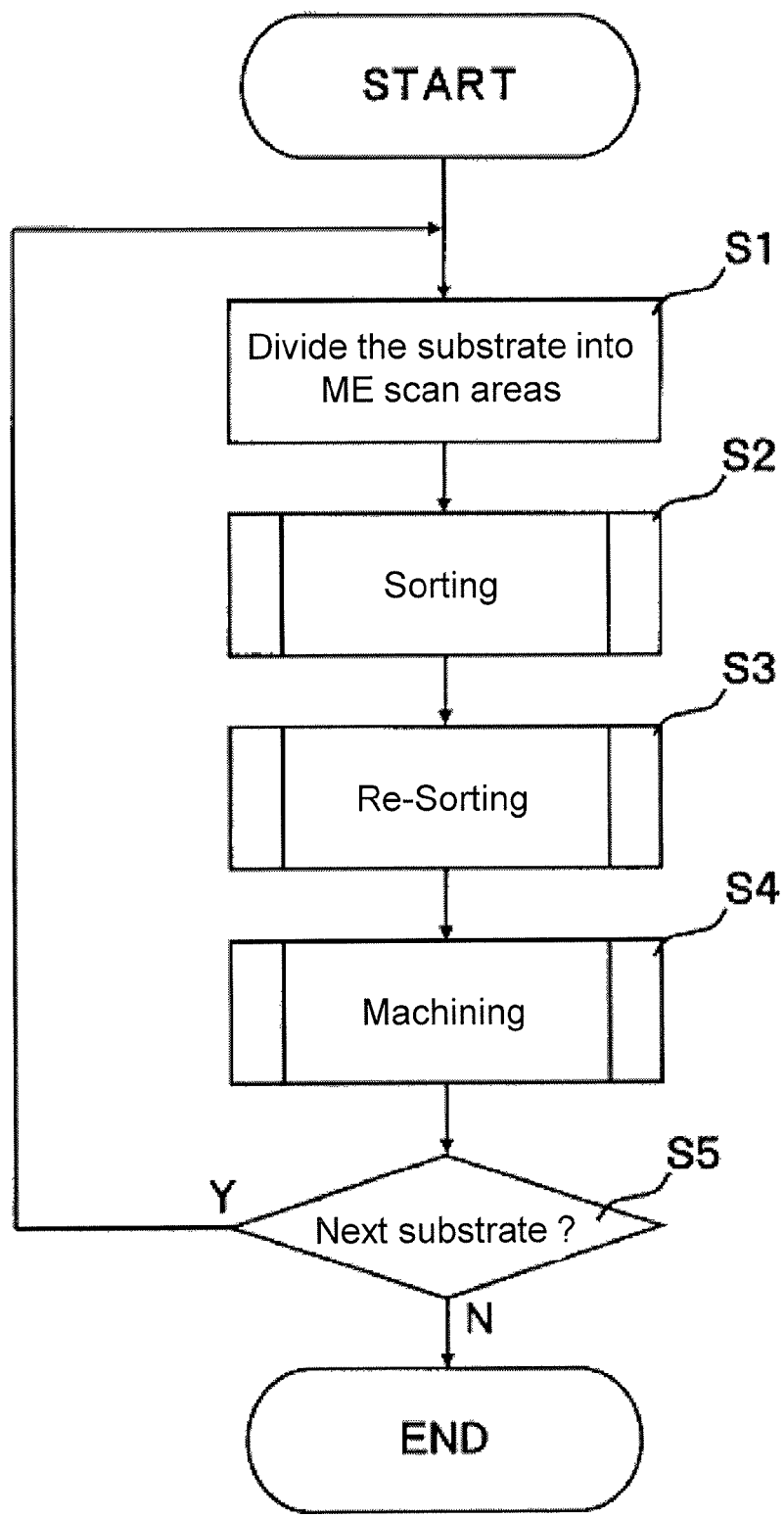
FIG. 3 is a flowchart showing a main routine of a hole machining process executed by a CPU in this embodiment.

FIG. 3 is a flowchart showing a main routine of a hole machining process executed by the CPU in this embodiment.

In the main routine of FIG. 3, first, the whole printed circuit board 5 is divided into scan areas 7 (ME areas in total), where the size of the scan area is determined by the size of the fθ lens 4 (step S1), and the process proceeds to a subroutine of a sorting process A. In the sorting process A, the position data of holes within a scan area 7 are sorted in order to obtain the shortest machining route (step S2). Subsequently, a subroutine of a re-sorting process B is executed (step S3). After completing the re-sorting process B, a subroutine of a machining process C is executed (step S4). The processes from step S1 to step S4 are repeated until machining all the printed circuit boards 5 to be machined is completed (step S5). The process of the main routine is finished when the machining all the printed circuit board 5 is completed.

Figure 4:
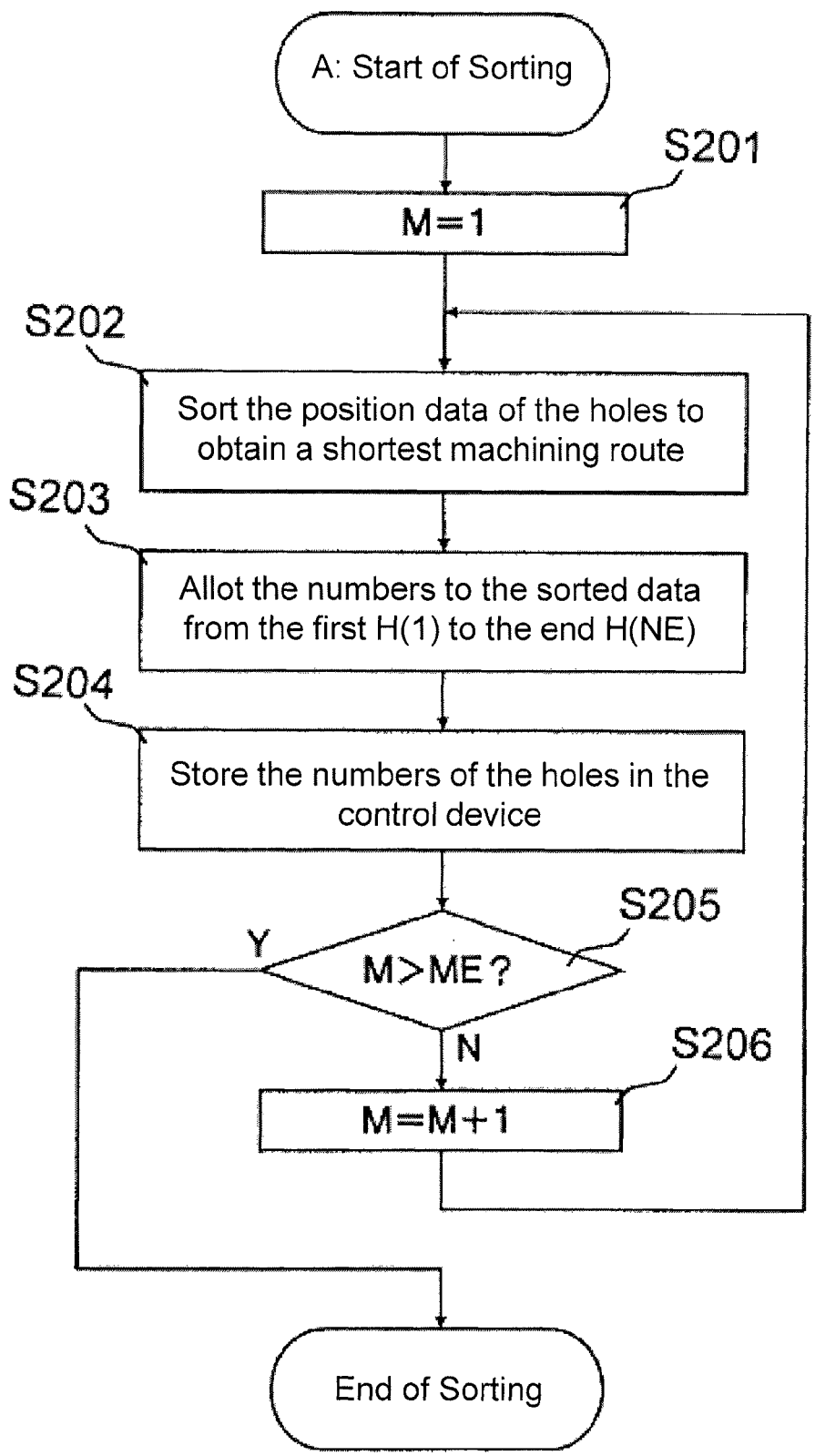
FIG. 4 is a flowchart showing a procedure in a subroutine of a sorting process.

FIG. 4 is a flowchart showing a procedure in the subroutine of the sorting process A. In the sorting process A, first, a variable M that indicates the number of a divided scan area 7 is set to one (step S201). A local search algorithm such as the 2-opt algorithm is used to sort the position data of the holes within the scan area 7 in an order such that a machining route becomes shortest (step S202). The sorted holes are allotted numbers from the first hole H(1) to the end hole H(NE) (the NE-th hole where NE is an integer equal to or more than two) in the order (step S203). The respective coordinates of the holes from the first H(1) to the NE-th H(NE) are stored in (the memory of) the control device 8 (step S204). Subsequently, it is determined whether or not the present scan area is the end scan area ME (step S205). In this determination, the variable M is incremented by one in the case where the variable M is smaller than ME (step S206), and the process proceeds to step S202, and the subsequent processes are repeated. The sorting process is completed when the variable M is equal to ME in step S205 (when the present scan area is set to the end scan area ME).

Figure 5:
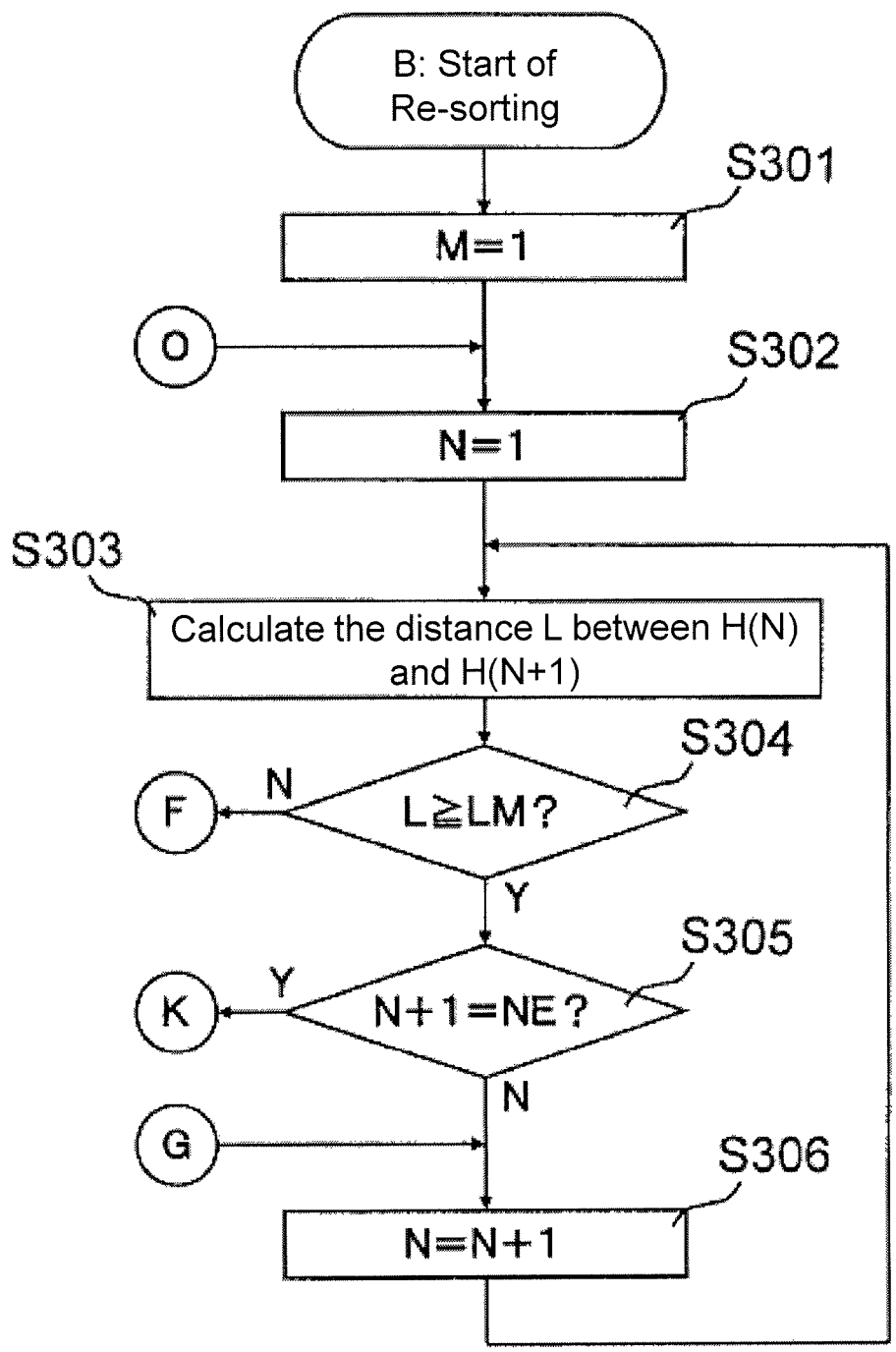
FIG. 5 is a flowchart (Process 1) showing a procedure in a subroutine of a re-sorting process.
Figure 6:
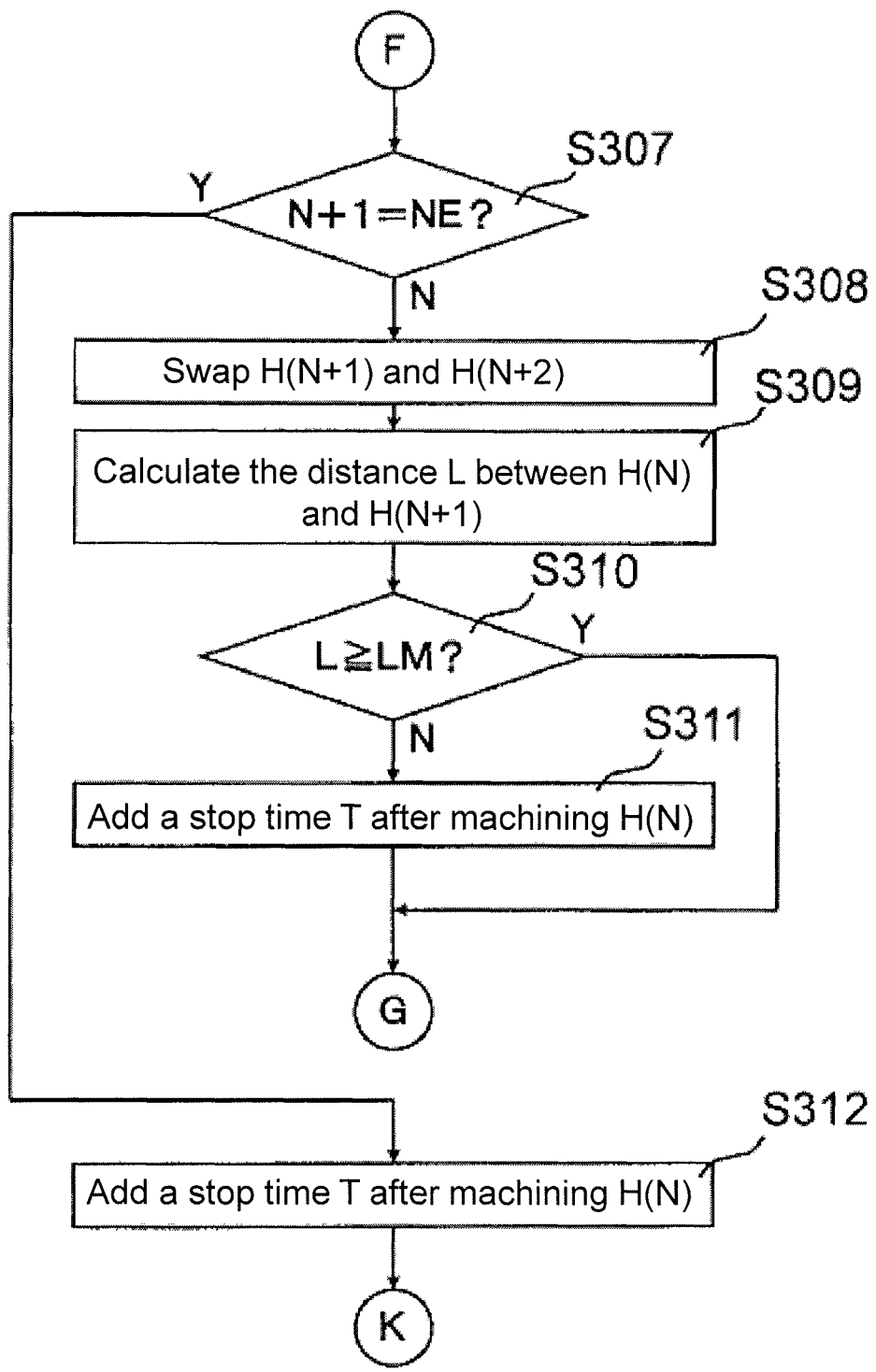
FIG. 6 is a flowchart (Process 2) showing a procedure in the subroutine of the re-sorting process.
Figure 7:
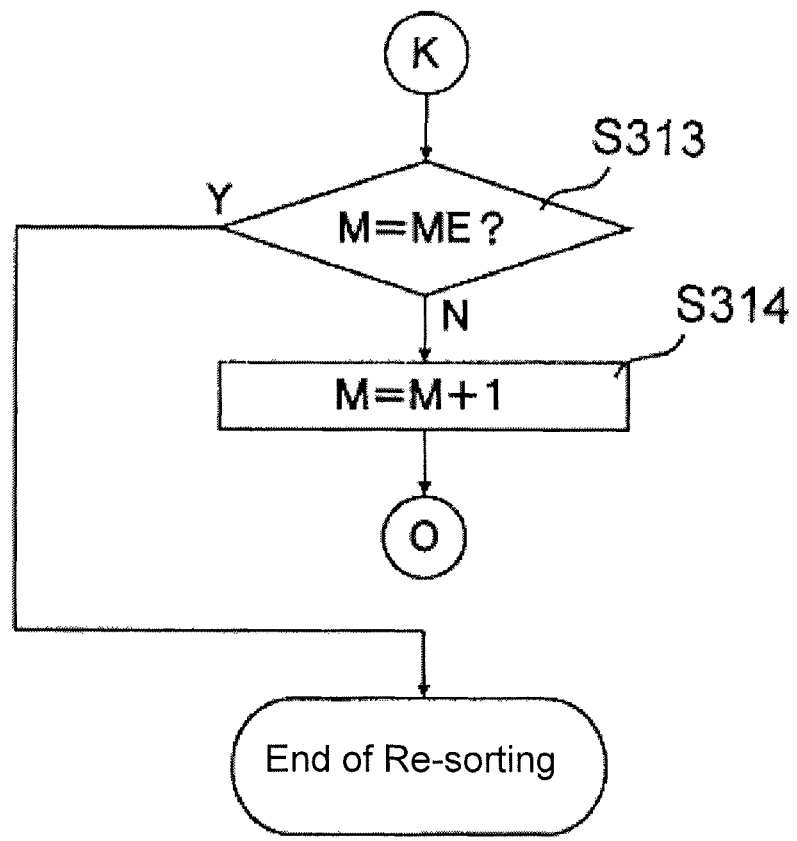
FIG. 7 is a flowchart (Process 3) showing a procedure in the subroutine of the re-sorting process.

FIGS. 5, 6, and 7 are flowcharts of procedures in the subroutine of the re-sorting process B. In the re-sorting process, after the sorting process A is completed (Y in step S205), the variable M is set to one (step S301) and a hole number N is set to one (step S302). Subsequently, the distance L between the N-th hole H(N) and the (N+1)th hole H(N+1) is calculated (step S303). In the case where the distance L is equal to or more than a predetermined threshold value LM (Y in step S304), then it is determined whether N+1 is the number of the end hole (step S305). In the case where this number does not corresponds to the end hole (N in step S305), the hole number is incremented by one taken as N=N+1 (step S306). Subsequently, the process returns to the step S303, and the subsequent processes are repeated. The threshold value LM is a distance where a hole diameter becomes larger due to influence of heating effects when the hole is consecutively machined immediately after the previous hole is machined.

In step S304, in the case where the distance L is less than the threshold value LM (N in step S304), the process proceeds to the flowchart in FIG. 6, and it is determined whether the hole number N+1 corresponds to the end hole (step S307). In this determination, in the case where the hole number N+1 does not correspond to the end hole (N in step S307), the (N+1)th hole H(N+1) and the (N+2)th hole H(N+2) are swapped (step S308), and the distance L between the N-th hole H(N) and the (N+1)th hole H(N+1) is calculated again (step S309). The distance L is then compared with the threshold value LM (step S310). In the case where the distance L is equal to or more than the threshold value LM, the process returns to the step S306 and the subsequent processes are repeated. On the other hand, in the case where the distance L is less than the threshold value LM (N in step S310), a stop time (a heat dissipation time) T is added for enough heat dissipation after machining of the N-th hole H(N) on the machining program (step S311), and the process returns to the step S306 and the subsequent processes are repeated.

In the case where it is determined that N+1 is the number NE of the end hole in step S307, the stop time T is added for enough heat dissipation after machining of the N-th hole H(N) on the machining program (step S312). Subsequently, the process proceeds to step S313 in the flowchart of FIG. 7, and it is determined whether the next scan area 7 to be machined exists in step S313, that is, whether M=ME is satisfied. In the case where the next scan area 7 to be machined exists (N in step S313), the variable M is incremented by one taken as M=M+1 (step S314). Subsequently, the process proceeds to the process in step S302 and the subsequent processes are repeated. In the case where the next scan area 7 to be machined does not exist in step S313 (Y in step S313), the re-sorting process is completed.

Figure 8:
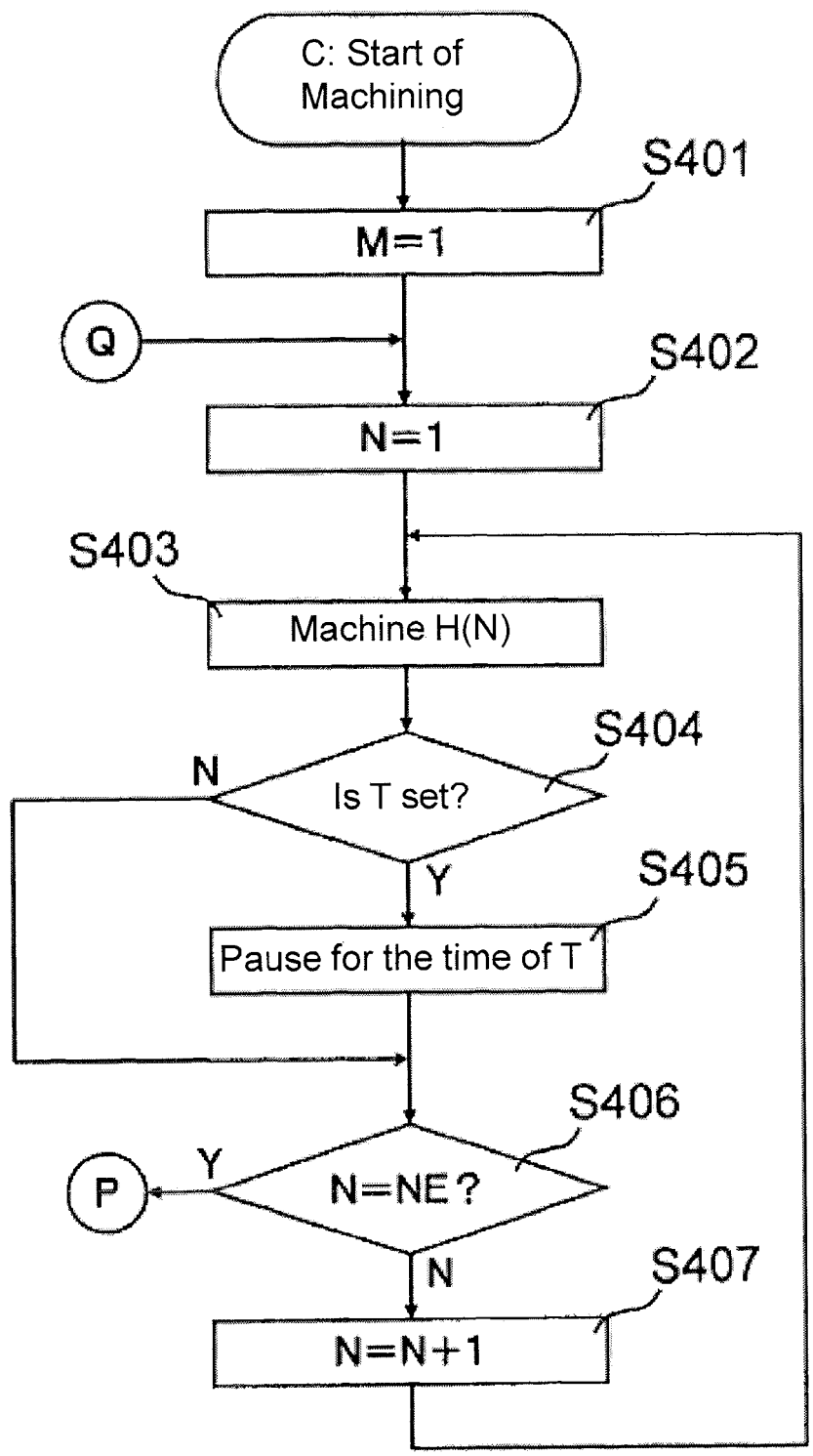
FIG. 8 is a flowchart (Process 1) showing a procedure in a subroutine of a machining process.
Figure 9:
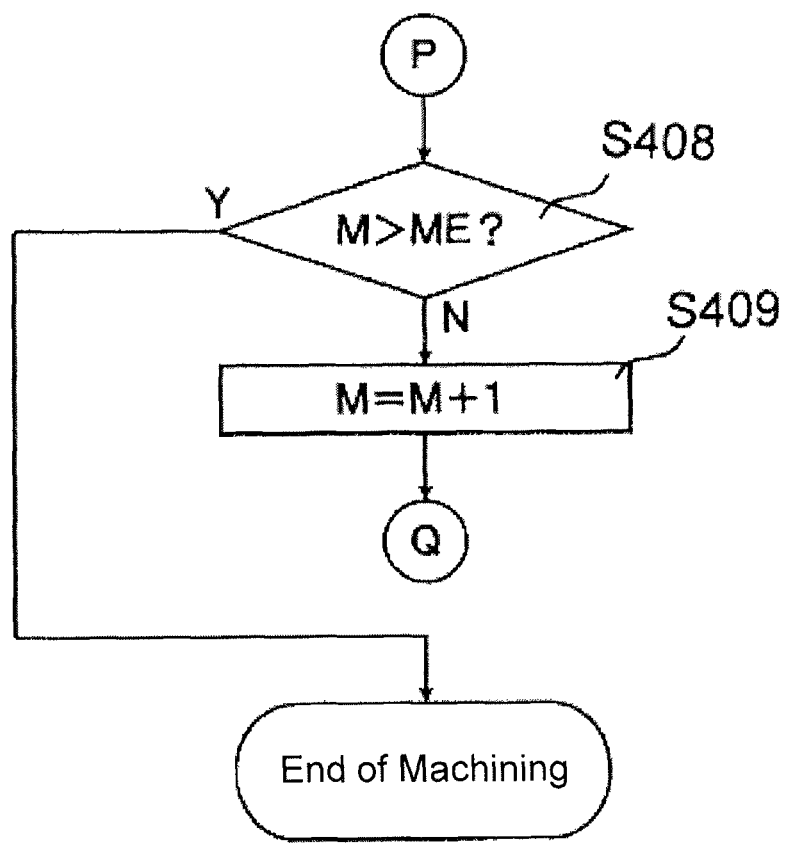
FIG. 9 is a flowchart (Process 2) showing a procedure in a subroutine of the machining process.

FIGS. 8 and 9 are flowcharts showing procedures in the subroutine of the machining process C. In the machining process C, first, the variable M indicating the scan area 7 is set to one (step S401) and the hole number N is set to one (step S402). The N-th hole H(N) is machined (step S403). Subsequently, in the case where the stop time T for enough heat dissipation is set after the machining of the N-th hole H(N) on the machining program (Y in step S404), the machining is paused for the stop time T (step S405). In the case where the stop time T is not set (N in step S404), it is determined whether or not N is the number NE of the end hole without stop (step S406).

In this determination, in the case where N is the number NE of the end hole (Y in step S406) and the next scan area 7 to be machined does not exist (Y in step S408), the machining process C is completed and the process proceeds to step S5. In the case where the next scan area 7 to be machined exists (N in step S408), M=M+1 is set (step S409). Subsequently, the process returns to step S402 and the subsequent processes are repeated. In the case where N is not the number NE of the end hole in step S406 (N in step S406), N is incremented by one (step S407). Subsequently, the process returns to step S403 and the subsequent processes after step S403 are repeated.

Figure 10:
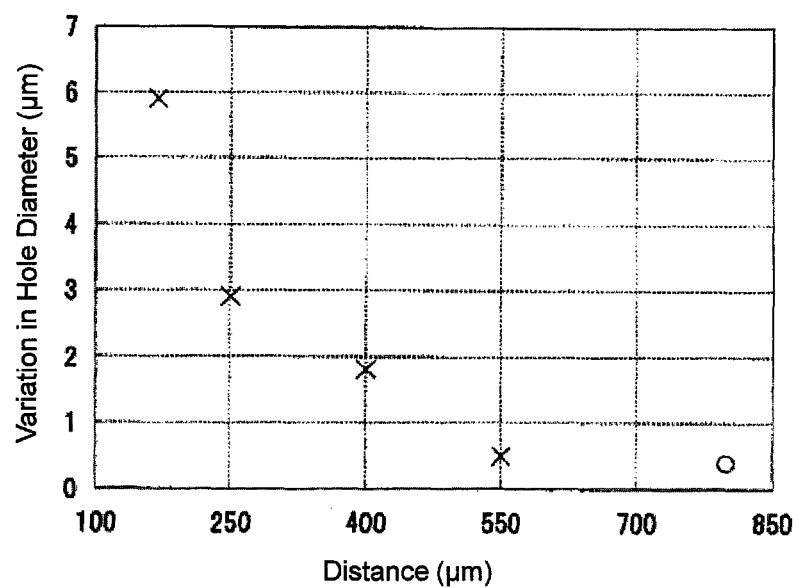
FIG. 10 is a graph showing measurement results of variation in hole diameter while a distance is varied.

FIG. 10 is a graph showing measurement results of variation in hole diameter while the distance L is varied. The variation in hole diameter on the vertical axis indicates a value where a hole diameter of 65 µm is subtracted from a measured value of a hole diameter. The hole diameter is machined by laser machining with a hole diameter of 65 µm.

The variation in hole diameter without quality problem (denoted by circle) is equal to or less than 0.4 µm. It is seen that the threshold value LM of the distance L is simply set equal to or more than about 800 µm to have the variation in hole diameter that is equal to or less than 0.4 µm based on FIG. 10. In the experiment, it turned out that setting the stop time T equal to or more than 10 msec resulted in the variation in hole diameter that was equal to or less than 0.4 µm even in the case where the distance L was less than 800 µm.

Regarding the threshold value LM and the stop time T, a hole diameter, a threshold value LM, and the stop time T are preliminarily measured with the actual apparatus for each kind of printed circuit boards as a machining target. These results are stored in the memory that receives the coordinate values. The memory stores the measurement results as a table for example. The CPU refers to the table as necessary to reflect the value on the table in the control.

As described above, with this embodiment, the order of the holes H within the scan area 7 is sorted to set the shortest machining route. In the case where the distance L between two sequential holes targeted for drilling is shorter than the threshold value LM, the machining is stopped for enough heat dissipation for the predetermined period of the time T before machining of the next hole. This minimizes the variation in hole diameter due to heating effects even in the case where the shortest machining route is set, and improves machining quality.

The laser beam source in the claims corresponds to the laser beam source 1 in this embodiment. The laser beam corresponds to the laser beam 2. The scanning means corresponds to the first and second galvanometer mirrors 3a and 3b and the fθ lens 4. The XY table corresponds to the XY table 6. The printed circuit board corresponds to the printed circuit board 5. The laser machining apparatus corresponds to the laser machining apparatus 100. The distance corresponds to the distance L. The threshold value corresponds to the threshold value LM. The heat dissipation time corresponds to the stop time T. The dividing corresponds to step S1. The sorting corresponds to the sorting process A (in step S2) that includes steps S201 to S206. The swapping corresponds to steps S303 to S308 (the re-sorting process B in step S3). The pausing corresponds to step S404 and step S405 (the machining process C). The dividing, the sorting, the swapping, and the pausing are set as the program of the CPU in the control device 8, and are executed by the CPU.

It will be appreciated that the present invention will not be limited to the embodiment described above, but various modifications are possible without departing from the technical scope of the present invention. The present invention is subject to all of the technical matters included in the technical idea described in the claims. The embodiment described above shows a preferred example. Various alternatives, modifications, variations, or refinements will be apparent to those skilled in the art based on the content disclosed in this Description. These examples may fall within the technical scope described in the appended claims.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A laser machining method for performing a plurality of drill machining on a printed circuit board with a laser beam, comprising:

providing a scanning means for scanning the laser beam onto a surface of the printed circuit board in an X direction and a Y direction, the laser beam being emitted from a laser beam source;

providing an XY table for moving the printed circuit board in the X direction and the Y direction;

dividing the printed circuit board to be scanned by the laser beam into a plurality of scan areas;

sorting an order of drilling within each scan area to obtain a scanning route with a shortest distance;

swapping the order of the (N+1)th hole and the (N+2)th hole, in each scanning area, if it is determined that the distance between the N-th hole and the (N+1)th hole (here, N is an integer in a range of "1≤N≤"the maximum number of holes to be drilled in the area"−1) is less than a predetermined threshold value, and that the (N+1)th hole does not correspond to the maximum number of the holes to be drilled in the scanning area; and machining each scanning area, specifically in machining the N-th hole and then machining the (N+1)th hole after pausing for a period of a predetermined heat dissipation time if it is determined that the distance between the N-th hole and the (N+1)th hole swapped is less than the predetermined threshold value.

2. A laser machining apparatus, comprising
a controller for performing the laser machining method according to claim 1.

3. A computer-readable storage medium storing a laser machining program for performing the laser machining method according to claim 1 by a controller of a laser machining apparatus.

* * * * *